United States Patent [19]
Eastland

[11] 3,983,039

[45] Sept. 28, 1976

[54] NON-SYMMETRICAL REFLECTOR FOR ULTRAVIOLET CURING

[75] Inventor: Bernard J. Eastland, Olney, Md.

[73] Assignee: Fusion Systems Corporation, Rockville, Md.

[22] Filed: Mar. 3, 1975

[21] Appl. No.: 555,335

[52] U.S. Cl. .............................. 250/492 R; 250/504

[51] Int. Cl.[2] .......................................... H01J 37/20

[58] Field of Search ........... 250/492, 493, 494, 504; 350/294, 299; 240/41.35 R, 41.35 C

[56] References Cited

UNITED STATES PATENTS

| | | | |
|---|---|---|---|
| 2,592,075 | 4/1952 | Smith | 240/41.35 R |
| 3,609,340 | 9/1971 | Habro | 340/41.35 C |
| 3,679,893 | 2/1972 | Shemitz et al. | 240/41.35 C |
| 3,733,461 | 5/1973 | Rohats | 250/493 |
| 3,777,135 | 12/1973 | Rees | 240/41.35 R |
| 3,784,836 | 1/1974 | Tolliver | 250/495 |
| 3,790,801 | 2/1974 | Coleman | 250/492 |

*Primary Examiner*—Alfred E. Smith
*Assistant Examiner*—Bruce C. Anderson
*Attorney, Agent, or Firm*—Beveridge, DeGrandi, Kline & Lunsford

[57] ABSTRACT

In an apparatus for curing photosensitive inks and coatings comprising an ultraviolet light emitting lamp unit comprised of a tubular elongated ultraviolet lamp and a reflector, and means for moving a substrate, on which said inks or coatings are deposited, under said lamp unit the improvement wherein said reflector is comprised of a first reflecting means for providing a region of peaked relatively high intensity illumination on said substrate and a second reflecting means for providing a region of relatively lower illumination upstream of said high intensity illumination for precuring the ink or coating on said substrate.

14 Claims, 6 Drawing Figures

PRIOR ART

NON-SYMMETRICAL REFLECTOR FOR ULTRAVIOLET CURING

The present invention is directed to an improved ultraviolet lamp for use in a photo-curing process and particularly to an improved reflector therefor.

The commercial curing of photosensitive coatings and inks with high intensity ultraviolet radiation is being used increasingly in a variety of process line industries. At least part of the reason for this is that ultraviolet curing has been found to posses both ecological and energy advantages over more conventional curing modes.

In general, in a photo-curing process, a substrate coated with ultraviolet sensitive material, either in the format of a continuous web or as individual sheets, is passed under an ultraviolet lamp or lamps which catalyze polymerization reactions thereby curing (or drying) the coating. The figure of merit commonly used in such radiation curing systems is the curing speed, which is the speed with which the material being cured can be passed beneath the lamp while still obtaining acceptable cure.

To increase the cure speed for some coatings it has been known in the prior art to pass the sample beneath a lamp emitting an intermediate or low level of ultraviolet radiation before it is passed beneath the main high intensity curing lamp. This "pre-curing" is effective primarily by virtue of sealing the surface layer of an un-cured photosensitive film, thereby eliminating or reducing the oxygen inhibition effect which, as will be described in greater detail below, tends to decrease the cure speed.

The pre-curing procedure as it has been practiced in the prior art has involved the use of two sources of radiation, an upstream relatively low intensity source to do the initial precuring and a relatively high intensity downstream source to do the main curing. Even with the use of the low power upstream lamp it was typically necessary to additionally use inert gas blanketing to inhibit the effect of oxygen before the main cure. The use of two sources of radiation with gas blanketing is necessarily relatively expensive, both in terms of equipment and energy, and this may be one reason why the pre-curing technique has not been used more extensively.

According to the present invention, a novel ultraviolet lamp unit is provided which performs both a precure and a main cure using but a single light source or lamp. The key to the present invention is a unique reflector which is comprised of a curved reflecting element in which the lamp is disposed and a substantially plane reflecting element extending in the upstream direction at an obtuse angle to the curved element. The novel reflector provides a peaked relatively high intensity region of illumination beneath the curved element for effecting the main curing and a more diffuse lower intensity region of illumination beneath the substantially plane element for effecting the precuring. The curved element may take on a variety of shapes and in the preferred embodiments is elliptically or parabolically shaped. Additionally, to increase the cure speed further, as will be explained below, a source of inert gas may be disposed in the lamp unit beneath the plane reflecting element. Hence according to the present invention a lamp unit is provided which actually eliminates an entire light source and its attendant expense, which was considered necessry in the prior art.

It is therefore an object of the invention to provide a lamp unit using a single lamp or light source which can perform both a pre-cure and a main cure in a photo-curing process.

It is a further object of the invention to provide a reflector for providing a peaked relatively high intensity region of illumination and a region of lower intensity illumination when a single elongated lamp is housed therein.

It is still a further object of the invention to provide a photo-curing apparatus which performs both a precure and a main cure on the material being processed using a single ultraviolet lamp.

The invention will be better understood by referring to the drawings in which.

Figure 1:
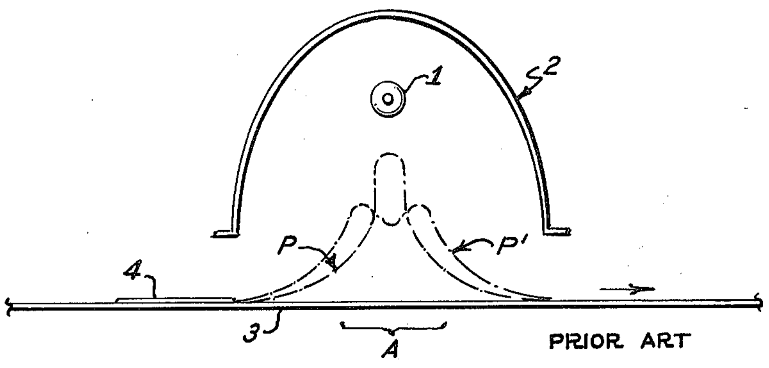
FIG. 1 is a cross-sectional view of a lamp unit utilizing a prior art elliptical reflector.

In general, it has been found that the curing speeds obtained with most commercial photosensitive inks and coatings increase with peak UV intensity and are more dependent on the peak intensity than on the total radiation flux. Thus, for instance, a single exposure to a lamp of 200 watts generally provides a faster curing speed than two successive exposures to a lamp or lamps of 100 watts. Since the largest possible peak UV intensity is generally desired, the use of symmetric focussed reflectors of elliptical cross-section such as shown in FIG. 1 has become common. In FIG. 1 tubular ultraviolet lamp 1, an end of which is shown in the Figure, is mounted by means known to those skilled in the art along a focus of elliptical reflector 2 shown in cross-section in the drawing. The profile of the reflector is identical in all cross-sections along its length, that is in the direction perpendicular to the plane of the paper and a single cross-section is therefore sufficient to illustrate the shape of the reflector. This is also true of the reflectors shown in cross-section in FIGS. 2 and 3, and 5 and 6.

The unit is disposed above platform 3 which may for instance be a conveyor belt conveying sample 4 beneath the lamp unit in the direction indicated by the arrow so that it may be cured. Sample 4 need not be a flat substrate as shown in the Figure, but may be of a variety of shapes and have any one of a variety of photosensitive inks or coatings thereon. To prevent as much light as possible from escaping from the lamp unit, the lower ends of the elliptical reflector are located as close to the platform 3 as is practical taking into consideration the size of the sample 4 as well as its anticipated up and down movement as it passes under the lamp unit.

The intensity characteristics of the lamp unit are shown in broken lines beneath the lamp 1. The curve P is obtained when the treated surface is passed through the second focus of the ellipse and when it is so passed, it is exposed to the maximum peak intensity for a given power UV lamp. When the surface to be treated is passed above the second focus of the ellipse, the radiation profile P', having two spaced maxima is obtained and the distance over which the maxima are effective is denoted as A shown beneath platform 3.

Figure 2:
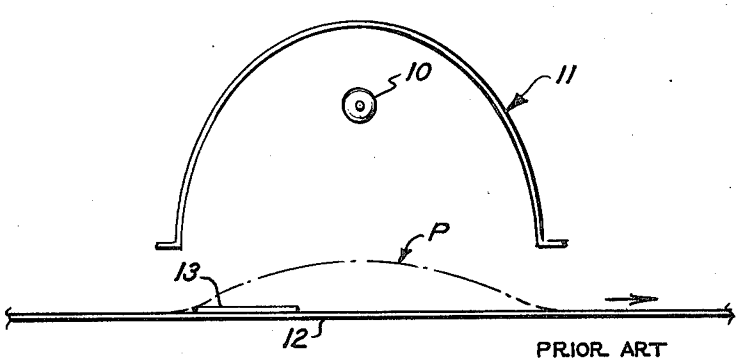
FIG. 2 is a cross-sectional view of a lamp unit utilizing a prior art non-elliptical reflector.

In FIG. 2, also a configuration utilized in the prior art, reflector 11 is a symmetric non-elliptical reflector having lamp 10 mounted along a line which is parallel to the longitudinal direction of the reflector. Intensity profile P is obtained with the lamp unit of FIG. 2 and as is seen, the peak of this profile is lower in magnitude than that obtained with the elliptical reflector of FIG. 1. Therefore in general the focussed geometry of FIG. 1 is superior to that of FIG. 2 in producing high cure speeds.

There are, however, some exceptions to the general rule that focussed symmetrical ellipses provide better curing than reflectors of other shapes. Since lamps have non-zero diameters and are not infinitely thin line sources, certain computer studies have been used to design modified symmetric ellipses which optimize the peak intensity on the substrate. A second exception occurs since some coatings are found to cure faster when passed above the second focus of the ellipse, thereby being exposed to the profile P' in FIG. 1. A third exception is that for some coatings, especially clear (non-pigmented topcoats and varnishes), the symmetric non-elliptical reflector of FIG. 2 can produce cure speeds comparable to those of the focussed reflector if the peak intensity in FIG. 2 exceeds some critical minimum value.

Irrespective of the prior art reflector used, an effect known as oxygen inhibition tends to reduce the obtainable cure speed. Oxygen inhibition takes place when the sample is exposed to air during curing and occurs because the oxygen in the ambient air destroys the free radicals and other intermediate chemical forms which participate in polymerization reactions. The extremely high UV intensities provided by high power lamps and focussed reflectors are successful to a certain extent in overcoming the oxygen inhibition effect by creating free radicals faster than oxygen can destroy them. Another approach to avoiding oxygen inhibition has been to use gas blanketing in which nitrogen, argon, or other gases, are blanketed over the photosensitive material when it passes beneath the UV lamp, thus excluding oxygen and enhancing cure rates.

Still another technique used to reduce the effect of oxygen inhibition has been to pre-cut the sample with an intermediate or low level of UV before the main curing is performed, and it is to this technique which the present invention is directed. Exposure to an intermediate or low-level of UV is often effective to seal the surface layer of an uncured photosensitive film thereby eliminating or reducing the effects of oxygen inhibition on the deeper layers. As a result, subsequent UV exposure is more effective in completing the cure and faster cure rates are achieved. However, as indicated above, when curing involving pre-curing has been performed in the prior art, it has always involved the use of two light sources, one of a relatively low intensity to provide the pre-cure or sealing effect and the other of relatively high intensity to provide the main cure. According to the present invention, as illustrated in conjunction with FIGS. 3 to 6, a lamp unit is provided which performs both a pre-cure and a main cure using a single lamp or light source.

Figure 3:
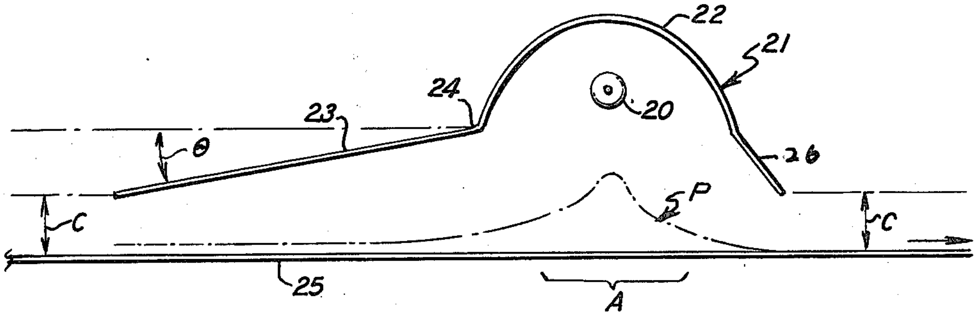
FIG. 3 is a cross-sectional view of a lamp unit according to an embodiment of the invention.
Figure 4:
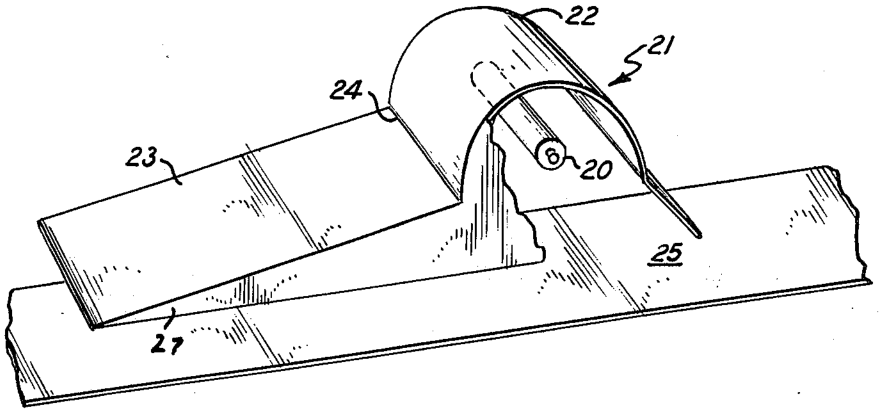
FIG. 4 is a perspective view, partially broken away, of the lamp unit shown in cross-section in FIG. 3.

In FIG. 3 a cross-section of one embodiment of the inventive lamp unit, illustrated in perspective in FIG. 4, is shown. As with the other Figures, the single cross-section shown in FIG. 3 is identical across the width of the lamp unit. Also the lamp 20 is secured in the reflector by conventional means known to those skillled in the art, which specifically will depend on the type of lamp, the type of cooling utilized for the unit, etc.

The reflector 21 shown in FIGS. 3 and 4 is comprised of a curved reflecting element 22 which may be elliptical, parabolic, or any other curve, and a substantially plane reflecting element 23 extending in the up-stream direction at an obtuse angle to portion 22. The intensity profile P is shown in FIG. 3 and it is seen that there is a region of peaked relatively high intensity illumination at A directly beneath the lamp and a region of low to intermediate intensity illumination beneath the front substantially plane portion 23. The illumination region beneath front reflector element 23 is effective to pre-cure a sample passed therethrough (to the right in FIG. 3) while the peaked relatively high intensity region beneath the lamp is well suited for performing the main curing operation. Hence when a sample is passed beneath the lamp unit from left to right in FIG. 3 both a pre-cure and main cure are effected.

Additionally, substantially plane reflector 23 reflects rays reflected from the substrate back on to the substrate rather than into the lamp or into non-reflecting nearby surfaces. One disadvantage of prior art symmetrical elliptical reflectors is that a fraction of the UV energy reflected by the coating back to the lamp is focussed into the lamp and re-absorbed thereby.

Figure 5:
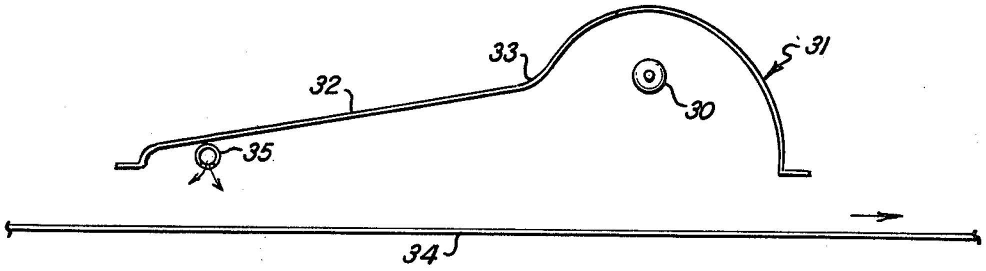
FIG. 5 is a cross-sectional view of another embodiment of a lamp according to the invention which includes an inert gas source.

The lamp unit is designed so that the clearance C shown at the front reflecting element is as small as possible which as indicated above is determined by practical process line considerations. In the embodiment of FIG. 3 the reflector 22 is shown as having a rear skirt substantially plane reflecting element portion 26 extending backward therefrom once again to make the clearance C as small as possible and raising the intensity in the area A of optimum curing. As with the front portion the rear skirt reflects rays back onto the substrate rather than into the lamp where they would be re-absorbed. In the alternative, as shown in the embodiment of FIG. 5, the rear portion may be formed by continuing the line of curvature of curved element 22 down to the lower-most point or arranging it to bend forwardly instead of bending backwards as shown in FIG. 3. Arranging the rear portion to extend along the line of curvature of element 22 or to be bent forwards probably provides a more efficient reflector than that shown in FIG. 3 wherein the rear portion is shown as being bent backwards. In a preferred embodiment the slope angle $\phi$ should be non-zero as $\phi = 0$ allows a relatively large percentage of rays to escape in the upstream direction. In FIG. 4 the lamp unit is shown with sides 27 to insure that the radiation is contained within the lamp unit and the exact nature of such sides as well as the connection of lamp 20 thereto will depend upon the particular mechanical details of design of the specific lamp utilized to which the present invention is not limited.

Existing curved reflectors may be modified in accordance with the teachings of the invention by connecting front and rear reflecting elements thereto and a typical structure resulting therefrom is shown in FIGS. 3 and 4. The ability to make such additions is limited only by the allowable clearance C and possibly by the space required for the front reflector in the upstream direction. More typically, reflectors made according to the invention may have all portions fabricated as part of a single structure as shown in FIG. 5. Additionally, the lamp unit according to the invention may be provided with a source of inert gas, as the front reflector provides an attractive and natural location therefor. In FIG. 5 inert gas source 35 which may be a tube extending across the substrate, as the lamp itself does, is shown. It is to be understood that any inert gas source which is operative to displace the oxygen at the surface being cured and to therefore increase the cure rate, may be utilized.

Figure 6:
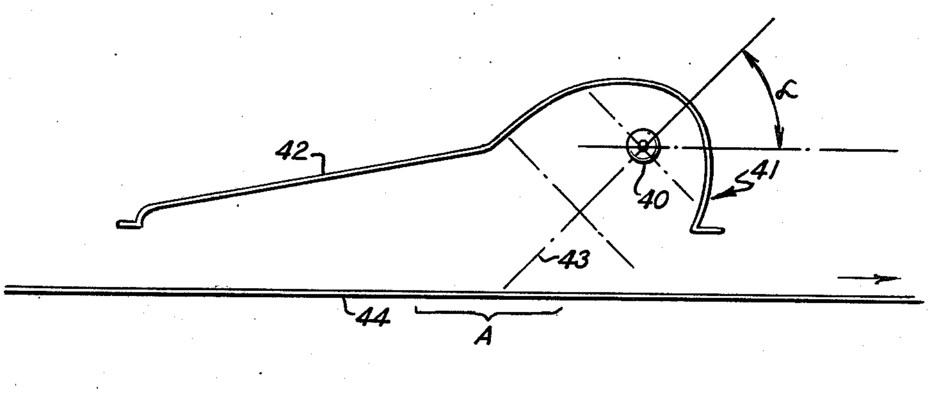
FIG. 6 is a cross-sectional view of still another embodiment of the lamp unit of the invention.

A further embodiment of the invention is shown in FIG. 6 in which the transverse axis of the curved reflecting element 41 is not perpendicular to platform 44. Thus $\alpha$ 90° and this particular design increases the amount of pre-exposure provided by the non-symmetric reflector. As in the other embodiments, curved reflecting element 41 may be an elliptical or parabolic reflector.

Additionally, instead of using a single front reflecting element it may be desirable in some applications to use a plurality of front reflecting elements disposed in a venetian blind like or overlapping configuration and any lamp unit using a plurality of front reflectors is within the scope of this invention.

Further, while I have described and illustrated a preferred embodiment of my invention, I wish it to be understood that I do not intend to be restricted solely thereto, but that I do intend to cover all modifications thereof which would be apparent to one skilled in the art and which come within the spirit and scope of my invention.

What is claimed is:

1. A lamp unit for use in curing photosensitive inks and coatings comprising a single elongated tubular ultraviolet lamp mounted in a reflector, said reflector being comprised of a first reflecting means partially surrounding said lamp for providing a region of peaked relatively high intensity illumination and a second reflecting means for providing a region of tapered relatively lower intensity illumination, said first reflecting means comprising a continuous curved surface having an axis of revolution, said second reflecting means comprising a plane surface extending outwardly from said curved surface and joining said curved surface at an obtuse angle so that said tapering increases in the outward direction of said plane surface, said lamp being mounted so that its longitudinal dimension is parallel to said axis of revolution.

2. The lamp unit of claim 1 wherein said plane surface extends outwardly from said curved surface at the bottom edge of said curved surface at one side thereof.

3. The lamp unit of claim 1 wherein said curved reflecting surface is elliptically shaped.

4. The lamp unit of claim 1 wherein said curved reflecting surface is parabolically shaped.

5. The lamp unit of claim 2 wherein said reflector further included a second plane surface extending outwardly from said curved surface at the bottom edge on the side opposite said one side thereof, said second plane surface being no longer in length than said first plane surface.

6. The lamp unit of claim 5 wherein said curved reflecting surface and said first and second plane surfaces are surfaces of discrete elements which have been secured together.

7. The lamp unit of claim 1 further including inert gas source means for displacing oxygen, disposed in said unit underneath said substantially plane surface.

8. In an apparatus for curing photosensitive inks or coatings comprising an ultraviolet light emitting lamp unit comprised of a single tubular elongated ultraviolet lamp and a reflector, and means for moving a substrate on which said inks or coatings are deposited under said lamp unit, the improvement wherein said reflector is comprised of a first reflecting means for providing a region of peaked relatively high intensity illumination on said substrate and a second reflecting means for providing a region of relatively lower illumination upstream of said high intensity illumination for pre-curing the ink or coating on said substrate.

9. The apparatus of claim 8 wherein said first means comprises a curved reflecting element and said elongated lamp is mounted parallel to the longitudinal axis of said curved reflecting element, and said second means comprises a substantially plane reflecting element extending outwardly and in the upstream direction from said curved element at an obtuse angle.

10. The apparatus of claim 9 wherein said plane element extends outwardly from said curved element at the bottom edge of said curved element at one side thereof.

11. The apparatus of claim 10 wherein said curved element is elliptically shaped.

12. The apparatus of claim 10 wherein said curved element is parabolically shaped.

13. The apparatus of claim 10 wherein the transverse axis of said curved element is not perpendicular to said substrate so that the mouth of said curved element faces in the upstream direction.

14. The apparatus of claim 10 further including an inert gas source disposed in said unit underneath said substantially plane element.

* * * * *